United States Patent
Itatani et al.

(10) Patent No.: US 7,968,437 B2
(45) Date of Patent: Jun. 28, 2011

(54) SEMICONDUCTOR DEVICE MANUFACTURING METHOD AND SUBSTRATE PROCESSING APPARATUS

(75) Inventors: Hideharu Itatani, Nanto (JP); Sadayoshi Horii, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 143 days.

(21) Appl. No.: 12/084,141

(22) PCT Filed: Nov. 10, 2006

(86) PCT No.: PCT/JP2006/322437
§ 371 (c)(1),
(2), (4) Date: Aug. 13, 2008

(87) PCT Pub. No.: WO2007/058120
PCT Pub. Date: May 24, 2007

(65) Prior Publication Data
US 2009/0130859 A1     May 21, 2009

(30) Foreign Application Priority Data
Nov. 18, 2005 (JP) .................... 2005-333489

(51) Int. Cl.
H01L 21/20 (2006.01)
(52) U.S. Cl. ........................................ 438/493
(58) Field of Classification Search .................. None
See application file for complete search history.

(56) References Cited

U.S. PATENT DOCUMENTS

| 5,237,756 | A  | * | 8/1993 | Hurwitt ........................ 34/406 |
| 7,314,835 | B2 | * | 1/2008 | Ishizaka et al. ............... 438/758 |
| 2006/0177601 | A1 | * | 8/2006 | Park et al. ...................... 427/576 |
| 2006/0210713 | A1 | * | 9/2006 | Brcka ........................ 427/255.28 |
| 2006/0210723 | A1 | * | 9/2006 | Ishizaka ........................ 427/569 |
| 2006/0211224 | A1 | * | 9/2006 | Matsuda ........................ 438/493 |

FOREIGN PATENT DOCUMENTS

| JP | 2003-253444 | 9/2003 |
| JP | 2005-509093 | 4/2005 |
| JP | 2005-513813 | 5/2005 |
| JP | 2006-506811 | 2/2006 |

\* cited by examiner

Primary Examiner — Charles Garber
Assistant Examiner — Andre' C Stevenson
(74) Attorney, Agent, or Firm — Kratz, Quintos & Hanson, LLP

(57) ABSTRACT

Productivity and product yield, as well as the step coverage and the adhesion are improved. A film forming process includes an initial film forming step, and a main film forming step. In the initial film forming step, a step of supplying a material gas into a processing chamber to adsorb the material gas on the substrate, and a step of supplying a first reaction gas not containing oxygen atoms into the processing chamber to cause a reaction with the material gas adsorbed on the substrate in order to from a thin film on the substrate, are repeated multiple cycles to form the thin film with the specified thickness on the substrate. In the main film forming step, a step of supplying a material gas into the processing chamber to adsorb the material gas on the substrate, and a step of supplying a second reaction gas containing oxygen atoms into the processing chamber to cause a reaction with the material gas adsorbed on the substrate in order to form a thin film on the substrate, are repeated multiple cycles, to form the thin film with a specified thickness on the thin film that was formed on the substrate in the initial film forming step.

16 Claims, 7 Drawing Sheets

SEMICONDUCTOR DEVICE MANUFACTURING METHOD AND SUBSTRATE PROCESSING APPARATUS

TECHNICAL FIELD

The present invention relates to a substrate processing apparatus and a semiconductor device manufacturing method for forming a thin film on a substrate.

BACKGROUND ART

Intensive research efforts are being made on the metal used in upper electrodes and lower electrodes, and increasing the permittivity in capacitive dielectric films to ensure a sufficient stored electrical charge as capacitors for DRAM become smaller in scale.

Potential choices for capacitive dielectric films include materials possessing high permittivity such as $Al_2O_3$, $ZrO_2$, $HfO_2$, $Y_2O_3$, $La_2O_3$, $STO(SrTiO_3)$, $Ta_2O_5$, $BST((Ba,Sr)TiO_3)$, and $PZT((Pb,Zr)TiO_3)$. Potential choices for electrodes include metals such as Ti, Hf, Zr, Al, Ru, Pt, and Ir, and oxides such as $SRO(SrRuO_3)$, $RuO_2$; or nitrides such as TiN, HfN, ZrN.

The electrode shape is mainly cylindrical shape with a high aspect ratio. In some cases, the above all films containing barrier metal films such as TiN or TaN must possess excellent step coverage.

Film forming methods are shifting from the conventional sputtering method to CVD methods that provide excellent step coverage, and mostly utilize the reaction between oxygen and an organo-metallic liquid material.

DISCLOSURE OF INVENTION

Problems to be Solved by Invention

Low temperatures are unavoidable when improving the step coverage in the CVD method.

Low temperatures leave many impurities such as carbon and hydrogen in the organic liquid material in the film and cause the electrical characteristics to deteriorate.

Most of Ru materials react easily with oxygen so that oxygen is utilized as the reaction gas.

However, after forming the film, the film is heat treated at high temperature to remove impurities in the film and crystallize film. The oxygen atoms remaining in the metallic film at this time diffuse into and oxidize the metallic film under Ru film, forming an insulating film, and causing the problem of high resistance.

Moreover, high temperature treating of impurities contained in Ru materials except for oxygen atoms causes the gas of impurities to separate from the film, making the film shrink, causing the problem that the irregularities on the surface deteriorate or the film peels.

A further problem is that an increased incubation time is reported in some Ru materials causing the problem of poor productivity.

In view of the above problems, the present invention has an object of providing a substrate processing apparatus and a semiconductor device manufacturing method for improving step coverage and adhesion properties, as well as boosting productivity and product yield.

Means for Solving the Problems

An aspect of the invention for resolving the aforementioned problems is described next.

A semiconductor device manufacturing method comprising:

a step of loading a substrate into a processing chamber;

an initial film forming step of forming a thin film with a specified thickness on the substrate by repeating one cycle operation multiple times, wherein the one cycle operation includes a step of supplying a material gas into the processing chamber to adsorb the material gas on the substrate, and a step of supplying a first reaction gas not containing oxygen atoms into the processing chamber to cause a reaction with the material gas adsorbed on the substrate in order to form a thin film on the substrate a main film forming step of forming a thin film with a specified thickness on the thin film formed on the substrate in the initial film forming step by repeating one cycle operation multiple times, wherein the one cycle operation includes a step of supplying a material gas into the processing chamber to adsorb the material gas on the substrate, and a step of supplying a second reaction gas containing oxygen atoms into the processing chamber to cause a reaction with the material gas adsorbed on the substrate in order to form a thin film on the substrate, and a step of unloading the substrate formed with the thin film of a specified thickness from the processing chamber.

Effects of Invention

The above aspect of the invention can provide a substrate processing apparatus and a semiconductor device manufacturing method capable of eliminating the problem of peeling, and deterioration of irregularities on the surface caused by film contraction and oxidation of the underlayer metallic film, and improving the step coverage and the adhesion properties, as well as boosting productivity and product yield.

BEST MODE FOR CARRYING OUT THE INVENTION

Figure 1:
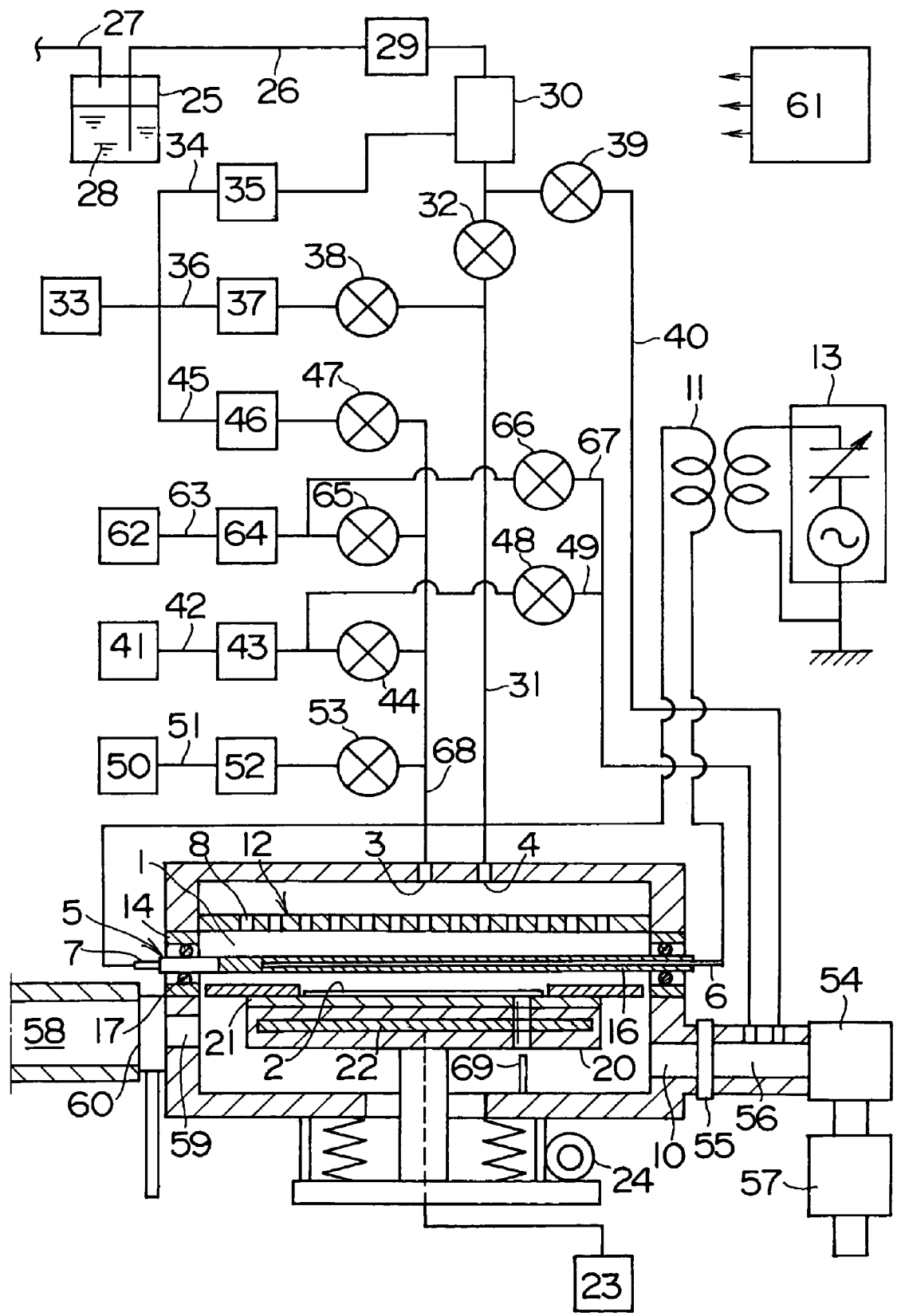
FIG. 1 is an overall diagrammatic view showing the single-wafer processing apparatus including the direct plasma unit as the first embodiment of the substrate processing apparatus of the present invention.

The preferred embodiment of the present invention forms a film by using Ru material gas and reaction gases excepting gases containing oxygen. However, the Ru material gas reacts poorly with reaction gases excepting gases containing oxygen and does not form a film.

Whereupon, utilizing a reaction gas excited by a plasma source causes the step coverage to deteriorate due to the gas phase reaction when the Ru material gas and the reaction gas excited by the plasma source are simultaneously supplied to the substrate. The film is therefore instead formed by ALD (Atomic Layer Deposition).

In the ALD method the following cycles are repeated.

(1) Just Ru material gas is supplied to the substrate so that the Ru material gas is adsorbed on the substrate with good step coverage.

(2) Excess material gas is exhausted by purging with inert gas such as Ar, He or $N_2$ gas.

(3) The reaction gas other than the gas containing oxygen excited by a plasma source is supplied to the substrate. The excited reaction gas reacts with the Ru material gas adsorbed on the substrate to form the film.

The gas excited by the plasma source has a high reaction property, and is combined with the carbon and the hydrogen contained in the Ru material gas and is vaporized, so that impurities in the film are reduced.

(4) Excess reaction gas is exhausted by purging with inert gas such as Ar, He or $N_2$ gas.

The above operations (1) through (4) as one cycle are repeated to obtain the desired, specified film thickness.

However, the film forming speed in the ALD method is slow so that productivity becomes progressively worse.

However, productivity can be improved if particles are formed on the substrate by the ALD method in the initial film forming step, and the conventional CVD method is used in the main film forming step to form the film by using gas containing oxygen as the reaction gas.

The film forming speed can be increased and productivity improved by performing the ALD method with a gas containing oxygen as the reaction gas.

By therefore utilizing a material adsorption step and the ALD method with a reaction gas other than a gas containing oxygen excited by a plasma source in the initial film forming step, a semiconductor device manufacturing method can be provided with a high product yield, and good step coverage and adhesion properties.

Moreover, by utilizing a gas containing oxygen as the reaction gas in the main film forming step, a semiconductor device manufacturing method with high productivity can be provided.

The best embodiments for carrying out the present invention are described next while referring to the drawings.

The first embodiment of the substrate processing apparatus of the present invention is described next while referring to FIG. 1.

FIG. 1 is an overall diagrammatic cross sectional view showing an example of the processing furnace in the single-wafer processing apparatus including a direct plasma unit as the first embodiment of the substrate processing apparatus of the present invention.

As shown in FIG. 1, a support stand 20 is installed in a processing chamber 1. The support stand 20 supports a substrate 2 such as the silicon wafer or glass substrate serving as the film forming object.

A susceptor 21 serving as a support plate is installed in the upper part of the support stand 20. This susceptor 21 is a part of the support stand 20. The substrate is mounted on the susceptor 21.

A heater 22 serving as the heater means is installed in the inner section of the support stand 20. The heater 22 heats the substrate 2 mounted on the susceptor 21.

A temperature controller 23 regulates the heater 22 so that the substrate 2 reaches a specified temperature.

An elevator mechanism 24 is installed in an external section of the processing chamber 1. The elevator mechanism 24 raises and lowers the support stand 20 within the processing chamber 1.

A shower head 12 and opposing electrode unit 5 are installed facing the substrate 2 in the upper part of the support stand 20 of the processing chamber 1. The shower head 12 contains multiple shower holes 8 as supply ports for directly supplying material gas and reaction gas to the substrate 2.

The opposing electrode unit 5 includes at least one more sets of opposing electrodes for applying high-frequency (RF) for generating plasma. These opposing electrodes are disposed facing the substrate 2 for film-forming at a position nearer the substrate 2 than the shower holes 8.

The opposing electrode unit 5 and the shower head 12 possessing multiple shower holes 8 are in this case installed facing the substrate 2 for film-forming.

More specifically, the shower head 12 is installed facing the opposing electrode unit 5; and the opposing electrode unit 5 is installed facing the substrate 2 for film-forming.

Figure 2:
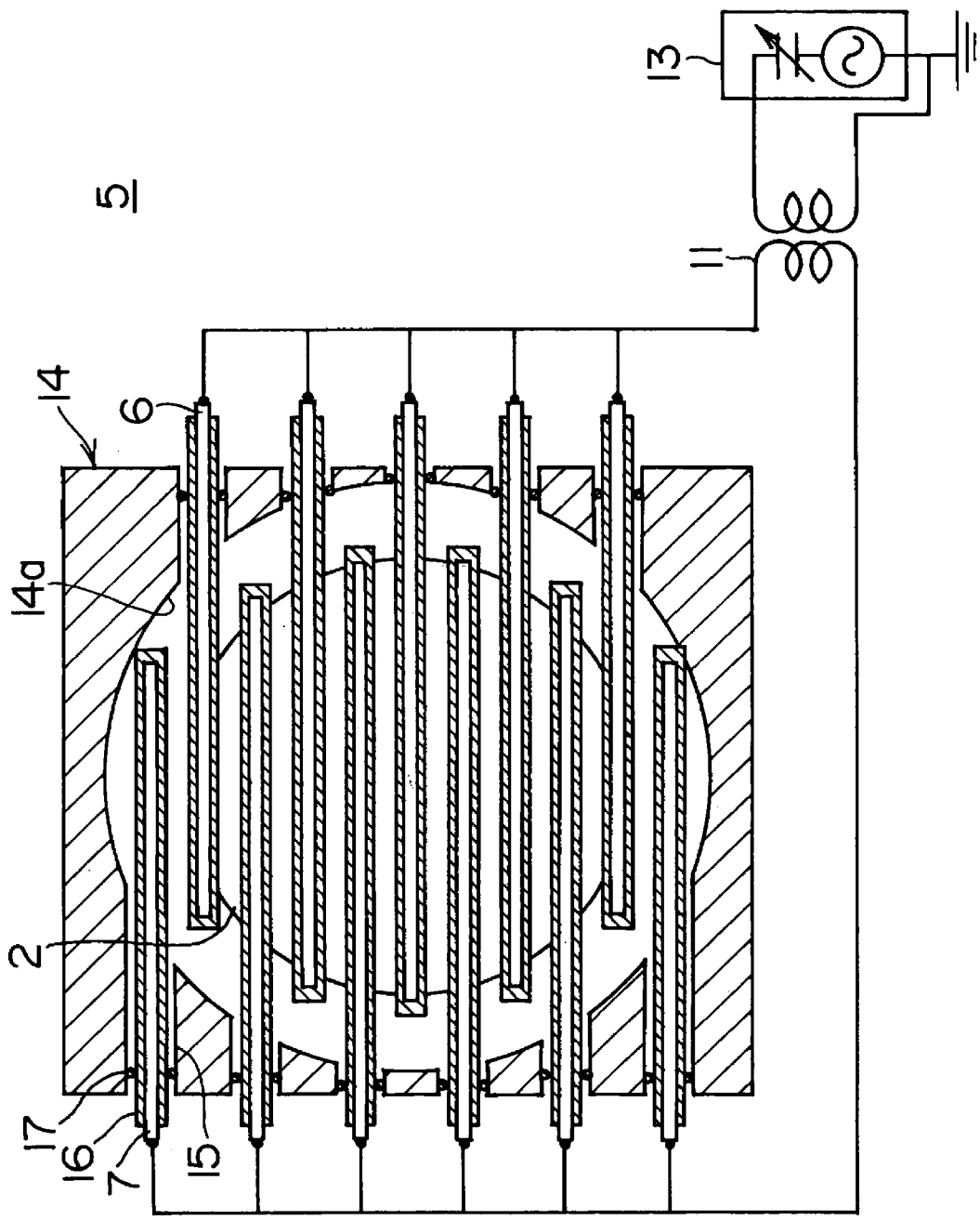
FIG. 2 is a plan view showing the direct plasma unit.

The opposing electrode unit 5 as shown in FIG. 2 for generating the plasma is made up of a unit containing an electrode 6 and an electrode 7 pair mutually facing each other.

In other words, the electrode 6 and the electrode 7 are formed in the shape of a comb spike, and each of these comb spikes is positioned offset a relative amount from the adjacent teeth. To restate this in other words, each tooth of the comb spike of the one electrode is inserted between the tooth and tooth of the comb spike of the other electrode. The electrode 6 and the electrode 7 are installed on the same plane surface.

As shown in FIG. 2, the opposing electrode unit 5 includes an electrode plate 14. A large circular window hole 14a is formed in the center on the upper surface of the electrode plate 14, and a through hole 15 is formed on the side surface. An electrode pipe 16 made from an insulating material such as quartz is inserted in the through hole 15, and a rod-shaped electrode 6 and the electrode 7 formed from a material such as Al or Ni are embedded in the electrode pipe 16.

In order to maintain the processing chamber 1 in a vacuum state, the electrode pipe 16 is vacuum-sealed by utilizing an O-ring 17 on the inner wall of the through hole 15 in the electrode plate 14.

The opposing electrode 6 and the opposing electrode 7 are respectively connected together, and connected to a insulation transformer 11. A high-frequency electric power supply unit 13 applies a high-frequency voltage to the insulation transformer 11 to generate plasma on the surface of the opposing electrode unit 5.

In other words, the plasma is generated near the upper surface of the opposing electrode unit 5 in the space between the opposing electrode unit 5 and the shower head 12, as well as near the lower surface of the opposing electrode unit 5 in the space between the opposing electrode unit 5 and the substrate 2.

Material gas and reaction gas are respectively supplied from a supply port 4 and a supply port 3 inside the shower head 12. The shower holes 8 on the shower head 12 supplies the material gas and the reaction gas separately or simultaneously as a shower to the substrate 2.

A material supply unit 25 for supplying a liquid material 28 is installed in the outside of the processing chamber 1. This material supply unit 25 connects by way of a liquid material supply pipe 26, and a liquid material flow rate controller 29 serving as a flow rate controller to regulate the supply quantity of liquid material, to a vaporizer 30 for vaporizing the liquid material.

The material supply unit 25 accumulates the liquid material 28. The liquid material 28 is supplied to the vaporizer 30 by the pressure of the inert gas such as He or Ar supplied from a pressure feed line 27.

A material gas supply pipe 31 connects to the vaporizer 30. The material gas supply pipe 31 connects the material gas supply port 4 by way of a valve 32.

For example, organic metal material that is liquid at room temperature, in other words, organic metallic liquid material is utilized as the liquid material.

Even a material such as a solid at room temperature is usable if heated to a few dozen degrees to form a liquid. In that case, heaters are installed respectively at the material supply unit 25, the liquid material supply pipe 26, and the liquid material flow rate controller 29 to heat each of them to a few dozen degrees.

An inert gas supply unit 33 is installed in the outside of the processing chamber 1. A carrier gas supply pipe 34 for supplying an inert gas as a non-reactive gas serving as the carrier gas to the vaporizer 30 is connected to the inert gas supply unit 33.

The carrier gas supply pipe 34 connects to the vaporizer 30 by way of a gas flow controller 35 serving as the flow rate controller to regulate the supply flow rate of the carrier gas.

The vaporizer 30 sprays the liquid material 28 along with the carrier gas within the interior to boost the vaporizing efficiency.

Gas such as Ar, He or $N_2$ may for example be utilized as the inert gas.

A purge gas supply pipe 36 connects to the inert gas supply unit 33 for supplying the inert gas as a non-reactive gas to the material gas supply pipe 31 as a purge gas. The purge gas supply pipe 36 connects to the material gas supply pipe 31 by way of a valve 38 and a gas flow rate controller 37 as the flow rate controller to regulate the supply flow rate of the purge gas.

When not supplying material gas vaporized in the vaporizer 30 from the material gas supply pipe 31 to the material gas supply port 4, then the valve 32 is closed, and a valve 39 opened, and material gas is made to flow in a material gas bypass pipe 40 serving as a vent line.

The material gas adsorbed on the surfaces of the processing chamber 1 and the opposing electrode unit 5 and the pipe from the valve 32 of the material gas supply pipe 31 to the material gas supply port 4 can be removed at this time by opening the valve 38 and supplying inert gas from the purge gas supply pipe 36.

A first reaction gas supply unit 41 for supplying the first reaction gas, is installed in the outside of the processing chamber 1. This first reaction gas supply unit 41 supplies the first reaction gas to a first reaction gas supply pipe 42.

The first reaction gas supply pipe 42 connects to a reaction gas supply port 3 by way of a valve 44, a reaction gas supply pipe 68, and a gas flow rate controller 43 serving as a flow rate controller to regulate the gas supply flow. A gas not containing oxygen atoms is utilized as the first reaction gas. In this embodiment, a gas containing hydrogen such as $H_2$ or $NH_3$ is utilized as the first reaction gas.

A purge gas supply pipe 45 for supplying an inert gas as a non-reactive gas to the reaction gas supply pipe 68 as a purge gas, connects to the inert gas supply unit 33.

This purge gas supply pipe 45 connects to the reaction gas supply pipe 68 by way of a valve 47 and a gas flow rate controller 46 as a flow rate controller to regulate the supply flow rate of the purge gas.

When not supplying the first reaction gas from the first reaction gas supply pipe 42 to the reaction gas supply port 3, the valve 44 is closed, a valve 48 is opened, and the first reaction gas is made to flow in a first reaction gas bypass pipe 49 serving as the vent line.

The first reaction gas adsorbed on the surfaces of the processing chamber 1 and the opposing electrode unit 5 and the pipe from the valve 44 of the first reaction gas supply pipe 42 to the reaction gas supply port 3 can be removed at this time by opening the valve 47 and supplying inert gas from the purge gas supply pipe 45.

A second reaction gas supply unit 62 for supplying a second reaction gas is installed in the outside of the processing chamber 1. This second reaction gas supply unit 62 supplies the second reaction gas to a second reaction gas supply pipe 63. The second reaction gas supply pipe 63 connects to the reaction gas supply port 3 by way of the reaction gas supply pipe 68, a valve 65, and a gas flow rate controller 64 as a flow rate controller to regulate the gas supply flow rate. Gases including oxygen atoms such as $O_2$ or $O_3$ or $N_2O$ may be utilized as the second reaction gas.

When not supplying the second reaction gas from the second reaction gas supply pipe 63 to the reaction gas supply port 3, the valve 65 is closed, a valve 66 is opened, and the second reaction gas is made to flow in a second reaction gas bypass pipe 67 serving as the vent line.

The second reaction gas adsorbed on the surfaces of the processing chamber 1 and the opposing electrode unit 5 and the pipe from the valve 65 of the second reaction gas supply pipe 63 to the reaction gas supply port 3 can be removed at this time by opening the valve 47 and supplying inert gas from the purge gas supply pipe 45.

A cleaning gas supply unit 50 for supplying a cleaning gas is installed in the outside of the processing chamber 1. The cleaning gas supply unit 50 supplies cleaning gas to a cleaning gas supply pipe 51.

This cleaning gas supply pipe 51 connects to the reaction gas supply port 3 by way of a valve 53, and a gas flow rate controller 52 as a flow rate controller to regulate the gas supply flow rate.

An exhaust port 10 is formed on a lower section of the side wall of the processing chamber 1. A vacuum pump 54, a material recovery trap 57 and an elimination device (not shown in drawing) are connected to the exhaust port 10 by an exhaust pipe 56. A pressure controller 55 for adjusting the pressure in the processing chamber 1 is installed in the exhaust pipe 56.

A substrate loading/unloading opening 59 is formed on the side surface on the side opposite the exhaust port 10 in the processing chamber 1. A gate valve 60 functioning as a sluice valve between a vacuum substrate transfer chamber 58 and the substrate loading/unloading opening 59, opens and closes the substrate loading/unloading opening 59. The substrate loading/unloading opening 59 is structured to allow loading/unloading of the substrate 2 to/from the processing chamber 1.

A main controller 61 regulates operation of each unit making up the substrate processing apparatus.

The first embodiment of the semiconductor device manufacturing method of the present invention is described next for the case where depositing the thin film on a substrate as a process within the manufacturing process for the semiconductor device by utilizing the single-wafer processing apparatus as mentioned above.

The first embodiment (hereinafter called "the first embodiment method") of the semiconductor device manufacturing method of the present invention is described next in FIG. 1 through FIG. 3, for the case where forming a Ru film on a substrate by the ALD (Atomic Layer Deposition) method and the CVD (Chemical Vapor Deposition) method and in particular the MOCVD (Metal Organic Chemical Vapor Deposition) method by utilizing $Ru(C_7H_{11}C_7H_9)$ (2,4-dimethylpentadienyl ethylcyclopentadienyl ruthenium, hereinafter abbreviated to DER) as the liquid material, and utilizing $H_2$ as the first reaction gas (initial film forming step), and $O_2$ as the second reaction gas (main film forming step). Thus, the single material DER is vaporized into a single material gas that is included in both the initial thin film forming step and the main film forming step.

In the following description, the main controller 61 controls the operation of each unit making up the substrate processing apparatus.

Figure 3:
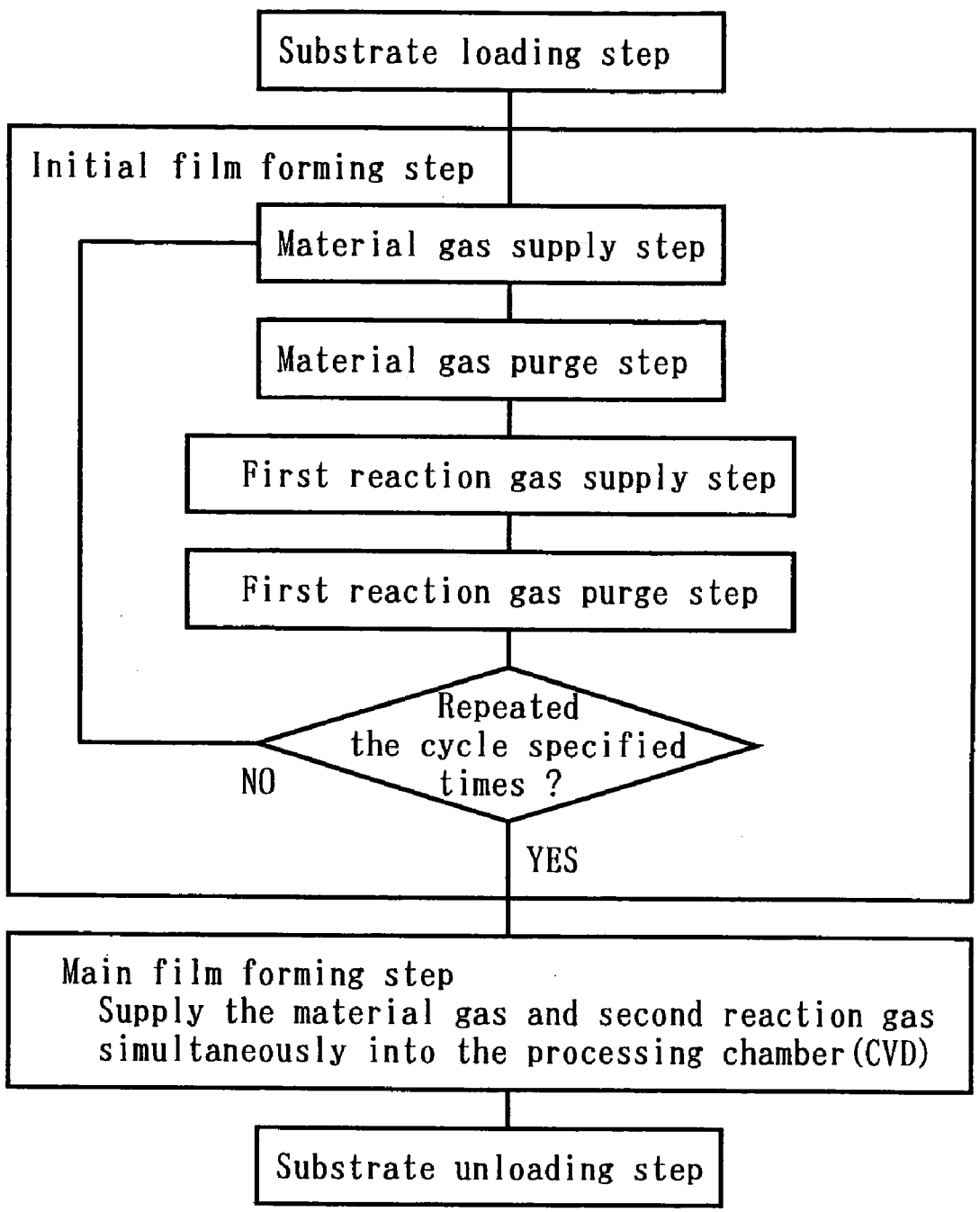
FIG. 3 is a flow chart showing the film-forming process for manufacturing the integrated circuit as the first embodiment of the semiconductor device manufacturing method of the present invention.

First of all, in the substrate loading step shown in FIG. 3, the substrate 2 is carried into the processing chamber 1.

In other words, the gate valve 60 opens while the support stand 20 is in a state where lowered to the substrate transferring position, and when the substrate loading/unloading opening 59 is opened, the substrate 2 is carried into the processing chamber 1 by a substrate transfer device not shown in the drawing. At this time, the support stand 20 is positioned at the transfer position by the elevator mechanism. At the transfer position, the tip of the substrate push-up pin 69 is at a higher position than the surface of the support stand 20, and the carried-in substrate 2 is transferred onto the substrate pushup pin 69.

The gate valve 60 closes after the substrate 2 is carried into the processing chamber 1. The support stand 20 rises from the transfer position to the substrate processing position. During that period, the substrate 2 is positioned on the susceptor 21 (substrate mounting step).

When the support stand 20 reaches the substrate processing position, electrical power is supplied to the heater 22 so that the substrate 2 is uniformly heated to a specified temperature (substrate temperature raising step).

The vacuum pump 54 simultaneously vacuum-exhausts the processing chamber, and is controlled to maintain a specified pressure (pressure adjustment step).

The valves 38 and the valve 47 respectively installed in the purge gas supply pipe 36 and the purge gas supply pipe 45, are kept open while transferring the substrate 2 and while heating the substrate and while adjusting the pressure, and the inert gas supply unit 33 keeps inert gas constantly flowing to the processing chamber 1.

Particles and metal contaminants are in this way prevented from adsorbed on the substrate 2.

The initial film forming step as shown in FIG. 3 is described next.

When the temperature of the substrate 2 and the pressure in the processing chamber 1 reach the specified processing temperature and the specified processing pressure and stabilize, the material gas, called the DER gas is supplied into the processing chamber 1 in the material gas supply step.

In other words, the liquid material flow rate controller 29 regulates the flow rate of the liquid DER supplied from the material supply unit 25. The carrier gas supplied from the inert gas supply unit 33 and regulated at a flow rate set by the gas flow rate controller 35, and the liquid DER are supplied to the vaporizer 30 and vaporized.

The vaporized DER gas flows at this time in the material gas bypass pipe 40 while the valve 39 is opened and the valve 32 is closed. When the vaporized quantity of the DER stabilizes, the valve 39 is closed and valve 32 is opened, and the vaporized DER gas is supplied by way of the material gas supply pipe 31 into the processing chamber 1, fed above the shower head 12, dispersed by the multiple shower holes 8, and supplied at a specified concentration onto the substrate 2.

After the DER gas has been supplied for the specified time, in the material gas purge step, the valve 32 is closed, and along with stopping the supply of the DER gas to the substrate 2, the valve 38 is opened, and an inert gas is supplied as the purge gas by way of the material gas supply pipe 31 into the processing chamber 1.

The material gas supply pipe 31 and the processing chamber 1 are in this way purged by the inert gas, and residual gas is removed.

In this case, preferably the valve 39 installed in material gas bypass pipe 40 opens and exhausts the DER gas by bypassing the processing chamber 1 via the material gas bypass pipe 40 so that the DER gas from the vaporizer 30 is not stopped.

Vaporizing the DER, and stabilizing the supply of vaporized DER gas takes time, so by allowing the DER gas to flow by bypassing the processing chamber 1 without stopping the supply of DER gas from the vaporizer 30, in the next material gas supply step, the DER gas can be stably supplied immediately to the substrate 2 by just switching the flow.

However, if a long time is required until the next material gas supply step, then some material will be needlessly disposed of. Therefore in some cases, the vaporizing by the vaporizer is preferably stopped to halt the unnecessary use of liquid material.

In this case, after opening the valve 39 installed in the material gas bypass pipe 40, and exhausting the DER gas by bypassing the processing chamber 1 via the material gas bypass pipe 40, the valve (not shown in drawing) within the vaporizer 30 is closed to set a state where only the carrier gas is allowed to flow. This step is the so-called material saving purge step.

In the next material gas supply step, in order to stabilize the supply of DER gas to the substrate 2 by swiftly switching the flow, during the reaction gas purge step related later on, the valve within the vaporizer 30 is opened while just the carrier gas is bypassing the processing chamber 1, and the vaporized state is stabilized.

After the processing chamber 1 has been purged for the specified time, the $H_2$ gas is supplied to the processing chamber 1 as the first reaction gas in the first reaction gas supply step.

In other words, after opening the valve 48 in a state where the valve 44 is closed (state where the first reaction gas has bypassed the processing chamber 1), the valve 48 is closed, the valve 44 is opened, and $H_2$ gas is supplied to the processing chamber 1 by way of the reaction gas supply pipe 68, fed above the shower head 12, and dispersed by the numerous spray holes 8.

After the $H_2$ is supplied at a uniform concentration to the opposing electrode unit 5, the high-frequency is applied across the opposing electrode 6 and the opposing electrode 7 to excite the plasma. The $H_2$ is at this stage supplied to the substrate 2 as an active species such as hydrogen atoms or hydrogen ions.

The high-frequency electric power supply unit 13 regulates the applied high-frequency output to an ideal output level.

After supplying $H_2$ as the reaction gas for specified time, in the first reaction gas purge step, the valve 44 is closed, and along with stopping the supply of $H_2$ to the substrate 2, the valve 47 is opened, and inert gas is supplied as the purge gas to the processing chamber 1 by way of the reaction gas supply pipe 68.

The inert gas in this way purges the residual gas from the reaction gas supply pipe 68 and the processing chamber 1.

Preferably in this case, the valve 48 installed in the reaction gas bypass pipe 49 is opened, and the reaction gas is exhausted while bypassing the processing chamber 1 via the gas bypass pipe 49, and the flow rate of $H_2$ from the gas flow rate controller 43 does not reach zero.

Time is required for the $H_2$ to transition from a zero flow rate to stabilize at the specified flow rate so that when the $H_2$ gas is made to flow while bypassing the processing chamber 1 without stopping the supply of $H_2$ from the first reaction gas supply unit 41, a stable supply of $H_2$ gas to the substrate 2 can be swiftly performed just by switching the flow in the next reaction gas supply step.

In the first reaction gas purge step, in order to stably supply the material gas promptly to the substrate 2 just by switching the flow in the next material gas supply step as described previously, the valve within the vaporizer 30 is opened allowing the DER gas to flow into the vaporizer, the vaporization starts, and the vaporization state stabilized while just the carrier gas from the carrier gas supply pipe is bypassing the processing chamber 1 in the period from a few seconds to ten or more seconds prior to the end of the first reaction gas purge step. This operation is necessary because a period from a few seconds to ten or more seconds is required to stabilize the vapor state in the vaporizer 30.

After the processing chamber 1 has been purged for the specified time, the valve 39 is closed, the valve 32 is opened, and the DER gas prepared ahead of time so as to vaporize at a specified flow rate, is fed into the processing chamber 1 by way of the material gas supply pipe 31, and the material gas supply step is then performed.

The initial film forming step as shown in FIG. 3, is performed as cycle processing where one cycle including the material gas supply step, the material gas purge step, the first reaction gas supply step, the first reaction gas purge step, is repeated in multiple cycles to form a thin film with the specified thickness on the substrate 2.

The main film forming step of forming a Ru film by the CVD method on the Ru film formed by the ALD method in the initial film forming step is described next.

In this main film forming step, the film is formed by the CVD method.

The liquid material flow rate controller 29 regulates the flow rate of the DER liquid supplied from the material supply unit 25. The gas flow rate controller 35 regulates the flow rate of the carrier gas supplied from the inert gas supply unit 33. Both the DER liquid and the carrier gas are supplied to the vaporizer 30 and vaporized.

The vaporized DER gas at this time flows in the material gas bypass pipe 40 while the valve 32 is closed and the valve 39 is opened. However, when the vapor quantity stabilizes, the valve 39 is closed, the valve 32 is opened, and the vaporized DER gas is supplied by way of the material gas supply pipe 31 into the processing chamber 1, and fed to above the shower head 12, and dispersed by the numerous shower holes 8 and supplied onto the substrate 2.

$O_2$ gas as the second reaction gas is simultaneously supplied along with the DER gas in the same way.

More specifically, starting from a state where the valve 66 is opened and the valve 65 is closed; the valve 66 is then closed and the valve 65 is opened. The $O_2$ gas is then supplied by way of the reaction gas supply pipe 68 into the processing chamber 1, and fed to above the shower head 12, and dispersed by the numerous shower holes 8 and supplied onto the substrate 2.

A Ru film is formed by the reaction between the $O_2$ and the DER gas supplied to the substrate 2.

High-frequency is not applied to the opposing electrode unit 5 at this time.

A thin film of a specified thickness can in this way be formed on the substrate 2 by regulating the time that the DER gas and the $O_2$ gas are supplied.

In the substrate unloading step shown in FIG. 3, after the thin film processing on the substrate 2 has been completed, the now processed substrate 2 is carried out from the processing chamber 1, in the reverse sequence of the substrate loading step.

The method of the first embodiment was previously described for the case where the main film forming step was performed by the CVD method. However, the main film forming step may also be carried out with the ALD method the same as in the initial film forming step.

The second embodiment (hereinafter, called "the second embodiment method") of the semiconductor device manufacturing method of the present invention by utilizing the ALD method in the same way as described in the first embodiment method in the initial film forming step, and by utilizing the ALD method in the main film forming step is described next while referring to FIG. 4.

The initial film forming step of this embodiment is identical to the first embodiment method so a description is omitted here.

The main film forming step is equivalent to the initial film forming step of the first embodiment method where $O_2$ is utilized instead of $H_2$ as the reaction gas so a description of steps other than the reaction gas supply step is omitted, and only the reaction gas supply step is described.

Figure 4:
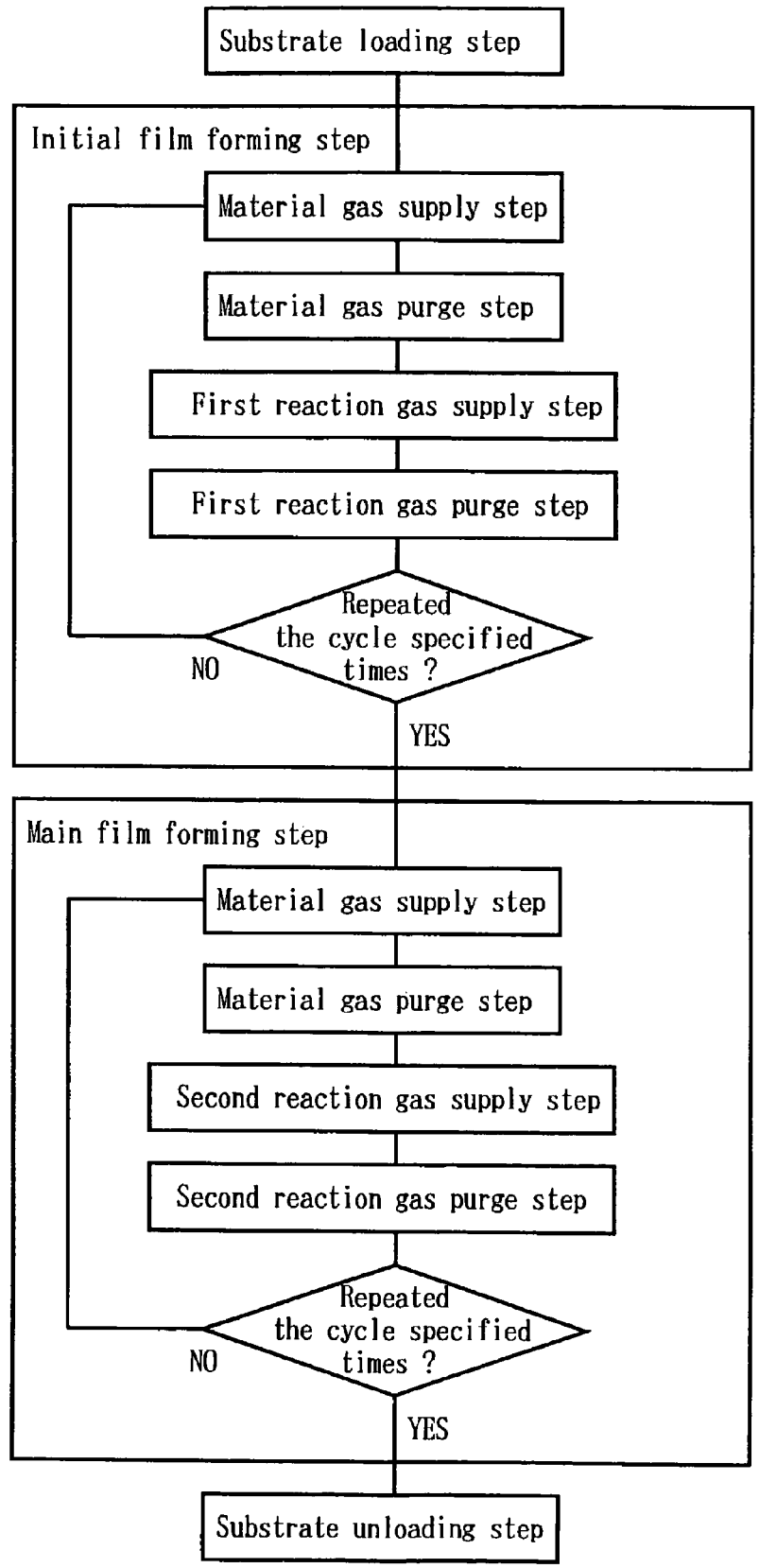
FIG. 4 is a flow chart showing the film-forming process for manufacturing the integrated circuit as the second embodiment of the semiconductor device manufacturing method of the present invention.

In the main film forming step as shown in FIG. 4, after completing the initial film forming step, the second reaction gas supply step is performed after completing the material gas supply step and the material gas purge step. In this second reaction gas supply step, $O_2$ gas is supplied as the second reaction gas into the processing chamber 1.

In other words, in a state where the valve 66 is opened and the valve 65 is closed, the valve 66 is then closed and the valve 65 opened. The $O_2$ gas is supplied by way of the reaction gas supply pipe 68 into the processing chamber 1, and fed to above the shower head 12 and dispersed by the numerous spray holes 8.

The $O_2$ gas is supplied at a uniform concentration to the opposing electrode unit 5 and then high-frequency is applied across the opposing electrode 6 and the opposing electrode 7 to excite the plasma. The $O_2$ is at this stage supplied to the substrate 2 as an active type such as oxygen atoms or oxygen ions.

The high-frequency electric power supply unit 13 regulates the high-frequency output applied across the opposing electrode 6 and the opposing electrode 7 to be an ideal output level different from the initial film forming step.

The high-frequency output applied across the opposing electrode 6 and the opposing electrode 7 may for example be 100 watts in the initial film forming step, and 150 watts in the main film forming step.

Moreover, the high-frequency output applied across the opposing electrode 6 and the opposing electrode 7 in the initial film forming step may be 150 watts, and in the main film forming step may be 100 watts.

The output may in other words by regulated to be a level ideal for the respective object in the initial film forming step and main film forming step.

The second reaction gas purge step is performed after the second reaction gas supply step.

In the main film forming step in the second embodiment method as shown in FIG. 4, a Ru film with a specified thickness can be formed on the Ru film formed on the substrate 2 in the initial film forming step. The main film forming step is cycle processing where multiple cycles are repeated with one cycle including: a material gas supply step, a material gas purge step, a second reaction gas supply step, and a second reaction gas purge step.

In the first embodiment method and the second embodiment method, processing conditions for the initial film forming step utilizing the ALD method, for example, are described here as: processing temperature: 200-350° C., processing pressure 10-400 Pa, DER flow rate: 0.01-0.2 g/minute, $H_2$ flow rate: 100-2,000 sccm, high-frequency output applied across opposing electrodes: 10-500 watts, each step time within 1 cycle: 1-10 seconds.

In the first embodiment method, processing conditions for performing the main film forming step by the CVD method, for example, are described here as: processing temperature: 200-350° C., processing pressure 10-400 Pa, DER flow rate: 0.01-0.2 g/minute, $O_2$ flow rate: 100-2,000 sccm.

In the second embodiment method, processing conditions for performing the main film forming step by the ALD method, for example, are described here as: processing temperature: 200-350° C., processing pressure 10-400 Pa, DER flow rate: 0.01-0.2 g/minute, $O_2$ flow rate: 100-2,000 sccm, high-frequency output applied across opposing electrodes: 0-500 watts, each step time within 1 cycle: 1-10 seconds.

For example, the film thickness is 1 to 5 nanometers in the initial film forming step, and 5 to 50 nanometers in the main film forming step.

Performing the initial film forming step and the main film forming step consecutively in the same processing chamber and the same temperature is preferable in terms of productivity and cost.

The first reaction gas utilized in this invention can be selected from diverse types according to the application. For example, $H_2$, $N_2$, $NH_3$, He, Ne, Ar, Kr, or Xe gas is utilized.

The film formed in this invention can be selected from diverse types according to the application. Metal such as Ru, Ir, Pt, Ti, Hf, Zr, Ta and W is utilized.

Figure 5:
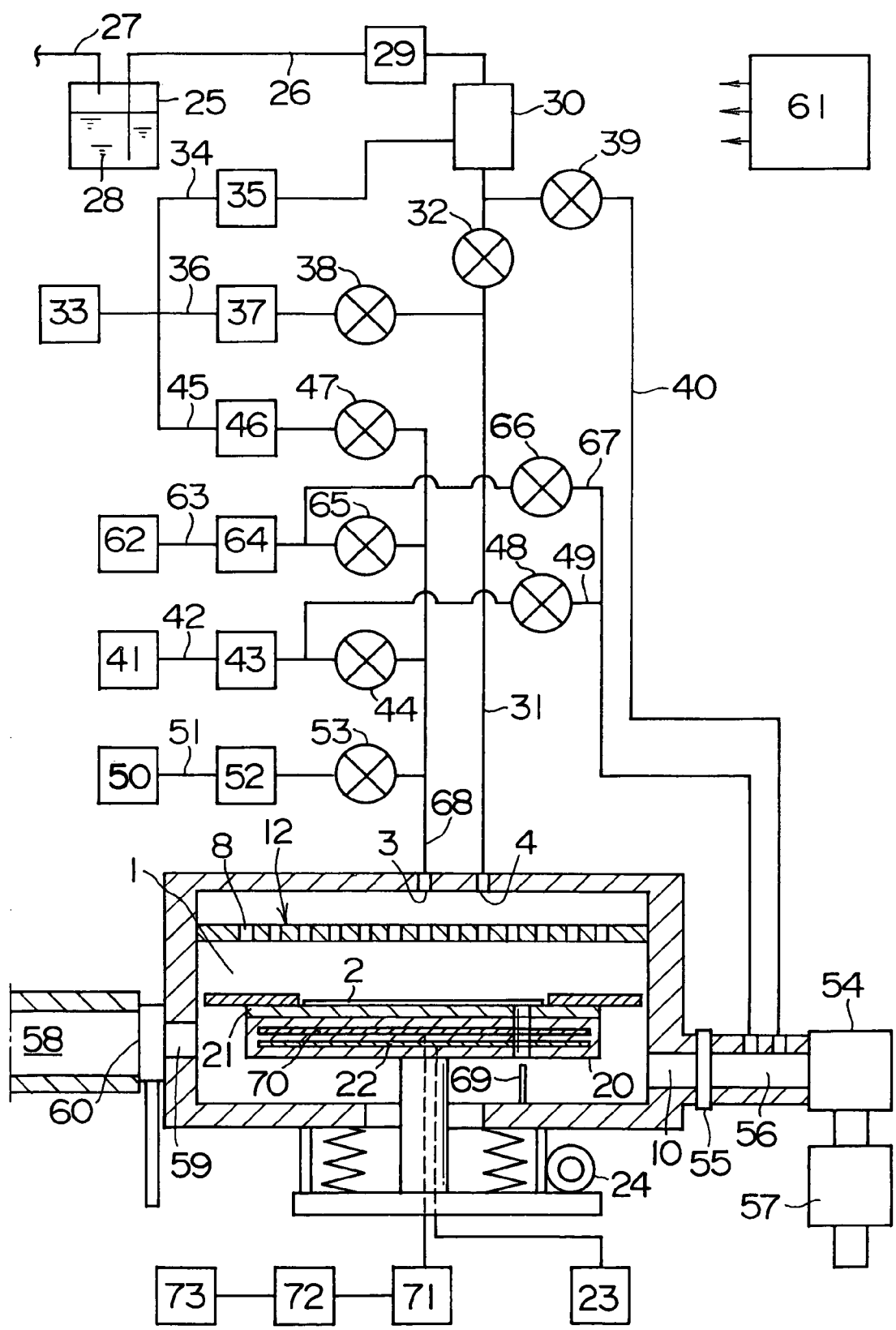
FIG. 5 is an overall diagrammatic view showing the single-wafer processing apparatus including the RF electrodes as the second embodiment of the substrate processing apparatus of the present invention.

FIG. 5 is an overall diagrammatic view showing the single-wafer processing apparatus in the second embodiment of the substrate processing apparatus of the present invention.

The single-wafer processing apparatus (FIG. 5) of the second embodiment differs from the single-wafer processing apparatus (FIG. 1) in the first embodiment in the point that there is no opposing electrode unit 5, and a RF electrode 70 has been installed on the support stand 20 instead of the opposing electrode unit 5. In other words, the plasma generator mechanism structure of the single-wafer processing apparatus of the second embodiment differs from the single-wafer processing apparatus of the first embodiment.

In the single-wafer processing apparatus (hereinafter, called "the second embodiment apparatus") of the second embodiment, a RF electrode 70 is embedded in the support stand 20 the same as the heater 22. This RF electrode 70 is connected to a RF matching box 71, a matching controller 72, and a RF electric power supply (RF generator) 73. Applying RF electric power to the RF electrode 70 during the flow of the first reaction gas or the second reaction gas generates plasma on the wafer.

This second embodiment apparatus structured as described above is also capable of performing the initial film forming step and the main film forming step, with the same first embodiment method and second embodiment method.

The third embodiment (hereinafter, called "the third embodiment method") of the semiconductor device manufacturing method of this invention is described next for the case where depositing a thin film on a substrate as one process in the overall manufacturing process for semiconductor devices and by utilizing the second embodiment apparatus with the above described structure.

The third embodiment method differs from the second embodiment method in the point that the reaction gas supply step has been separated into two stages. Namely, a step where the inner atmosphere of the processing chamber 1 is filled entirely with a reaction gas; and a step of applying RF electric power to the RF electrode 70 in a state where the inner atmosphere of the processing chamber 1 is filled entirely with a reaction gas to generate plasma. In other words, the third embodiment method differs from the second embodiment method in that a reaction gas pre-purge step (event) is provided prior to the step (event) of applying RF to generate the plasma.

The present inventors took note of the fact that the atmosphere (temperature, pressure, feed gas) within the processing chamber 1 changes the matching conditions for plasma generation. In other words, the matching conditions for generating plasma are changed by the temperature, pressure, and the type of gas being supplied. Therefore, when plasma not to be desired is supplied to the substrate, the film uniformity and the film adhesion sometimes deteriorates.

The matching conditions for plasma generation are sometimes unstable when applying RF simultaneously with the supply of the $NH_3$ in utilizing ammonia ($NH_3$) for example as the reaction gas.

The present inventors perceived that by providing a reaction gas pre-purge step (event) prior to the step (event) of applying RF to generate plasma, and applying the RF after the processing chamber 1 is filled entirely with a reaction gas, then the plasma supply can be stable and the deterioration in film uniformity and film adhesion can be alleviated.

The present inventors therefore contrived the third embodiment method based on this knowledge.

The film forming process in the third embodiment method is described next in detail for the case as shown in the flow chart of FIG. 6 where utilizing the second embodiment apparatus shown in FIG. 5.

The third embodiment method utilizes $NH_3$ gas as the first reaction gas in the initial film forming method.

Figure 6:
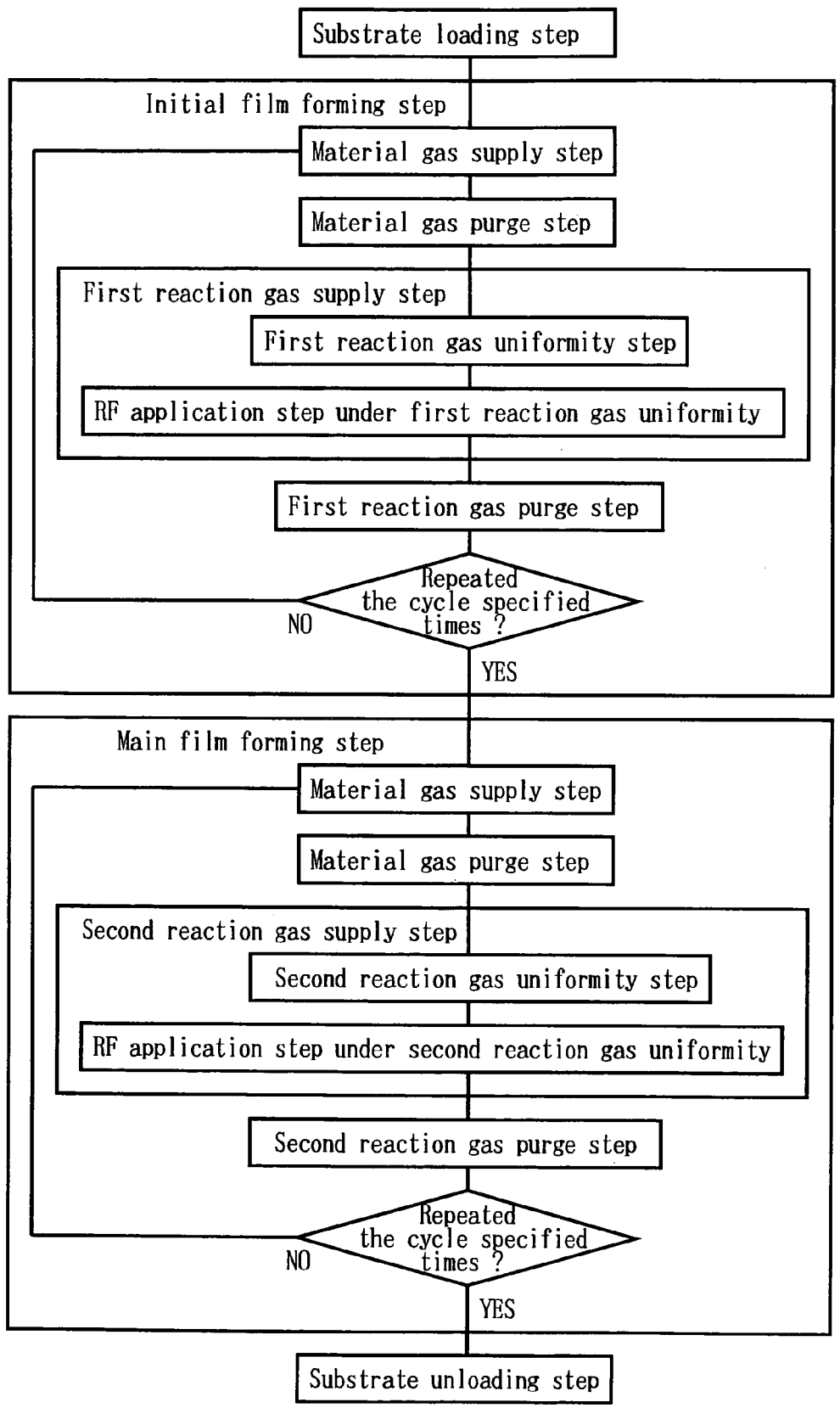
FIG. 6 is a flow chart showing the film-forming process for manufacturing the integrated circuit as the third embodiment of the semiconductor device manufacturing method of the present invention.

In the initial film forming step in the flow chart shown in FIG. 6, the $NH_3$ is supplied as the first reaction gas into the processing chamber 1 in the first reaction gas supply step, after completing the material gas supply step and the material gas purge step.

In other words, in the second embodiment apparatus shown in FIG. 5, in a state where the valve 48 is opened and the valve 44 is closed (state where the first reaction gas has bypassed the processing chamber 1), the valve 48 is closed, the valve 44 is opened, the $NH_3$ gas is supplied into the processing chamber 1 by way of the reaction gas supply pipe 68, is fed above the shower head 12, and dispersed by the numerous spray holes 8.

After continuously supplying the $NH_3$ for a specified time, the atmosphere within the processing chamber 1 becomes entirely filled with a uniform concentration of $NH_3$ (first reaction gas uniformity step).

By applying high-frequency electric power (RF electric power) to the RF electrode 70 while in this state, the $NH_3$ becomes plasma-excited. The $NH_3$ is at this stage supplied to the substrate 2 as an active species such as hydrogen atoms or hydrogen ions. The high-frequency electric power supply unit 13 regulates the applied RF to be an optimal output level (RF application step under first reaction gas uniformity).

Applying the high-frequency to the RF electrode 70 is stopped after the first reaction gas supply step. The first reaction gas purge step is then performed.

A Ru film with a specified thickness can be in this way formed on the substrate 2 by cycle processing where one cycle operation is repeated. The one cycle includes: a material gas supply step, a material gas purge step, a step of filling the processing chamber entirely with the first reaction gas (first stage of the first reaction gas supply step), a step of applying RF in a state where the processing chamber is filled entirely with the first reaction gas to generate plasma (second stage of the first reaction gas supply step), and the first reaction gas purge step.

In the third embodiment method, the second reaction gas supply step in the main film forming step is performed the same as in the initial film forming step.

Namely, after performing the material gas supply step and the material gas purge step in the main film forming step; $O_2$ is supplied into the processing chamber 1 as the second reaction gas in the second reaction gas supply step.

In other words, in a state where the valve 66 is opened and the valve 65 is closed, the valve 66 is then closed and the valve 65 is opened. The $O_2$ is supplied into the processing chamber 1 by way of the reaction gas supply pipe 68 and is fed above the shower head 12, and dispersed by the numerous spray holes 8.

After continuously supplying the $O_2$ for a specified time, the atmosphere within the processing chamber 1 becomes entirely filled with a uniform concentration of $O_2$ (second reaction gas uniformity step).

Applying RF to the RF electrode 70 in this state causes the $O_2$ to reach a plasma-excitation state. The $O_2$ is at this stage supplied to the substrate 2 as an active species such as oxygen atoms or oxygen ions (RF application step under second reaction gas uniformity).

After the second reaction gas supply step, the applying of high-frequency to the RF electrode 70 is stopped, and the second reaction gas purge step is then performed.

A Ru film with a specified thickness can be in this way formed on the Ru film formed on the substrate 2 in the initial film forming step by cycle processing where one cycle operation is repeated. The one cycle includes: a material gas supply step, a material gas purge step, a step of filling the processing chamber entirely with the second reaction gas (first stage of the second reaction gas supply step), a step of applying RF in a state where the processing chamber is filled entirely with the second reaction gas to generate plasma (second stage of the second reaction gas supply step), and the second reaction gas purge step.

In the third embodiment method, the reaction gas supply step is two stages. Namely, the reaction gas supply step is a step of making the processing chamber atmosphere entirely a reaction gas atmosphere, and a step of then applying RF in a state where the processing chamber is entirely filled with reaction gas, to generate plasma. A stable plasma supply is therefore provided, and the deterioration in film uniformity and film adhesion can be alleviated.

An example was described for the third embodiment method, where the reaction gas supply step was performed in two stages in the initial film forming step and the main film forming step. One stage was a step of making the processing chamber atmosphere entirely a reaction gas atmosphere, and the other stage was a step of then applying RF electric power to the RF electrode in a state where the processing chamber is entirely filled with reaction gas, to generate plasma. However, either the initial film forming step or the main film forming step may utilize the two-stage reaction gas supply step.

For example, just the initial film forming step where the $NH_3$ is supplied as reaction gas may utilize the two stage reaction gas supply step.

The technique used in the third embodiment method may also be applied to the first embodiment method. Namely, the reaction gas supply step in the initial film forming step of the first embodiment method may also be two stages made up of a step of making the processing chamber atmosphere entirely a reaction gas atmosphere, and a subsequent step of then applying RF in a state where the processing chamber is entirely filled with reaction gas to generate plasma.

However, utilizing a gas containing oxygen atoms (O) such as $O_2$ as the reaction gas in the initial film forming step may cause the underlayer to oxidize when forming the thin film For example, when utilizing a gas containing oxygen atoms (O) such as $O_2$ as the reaction gas in the initial film forming step, and utilizing a barrier metal as the underlayer of the film, then a barrier metal film (such as TiN) of the underlayer is oxidized, and an insulation layer ($TiO_2$) is formed which increases the contact resistance and causes the problem that the device characteristics deteriorate.

However, in the present invention, the reaction gas utilized in the initial film forming step does not contain oxygen atoms. The reaction gas utilizes such as $H_2$ gas or $NH_3$ gas. Therefore, no oxidation occurs on the barrier metal film of the underlayer.

Moreover, the main film forming step is performed in a state where the barrier metal film of the underlayer is covered with the film formed in the initial film forming step so that no oxidation of the barrier metal film of the underlayer will occur even if a gas containing oxygen atoms such as $O_2$ is utilized as the reaction gas.

The present invention can therefore be utilized to form a film with no oxidation of the underlayer.

Figure 7:
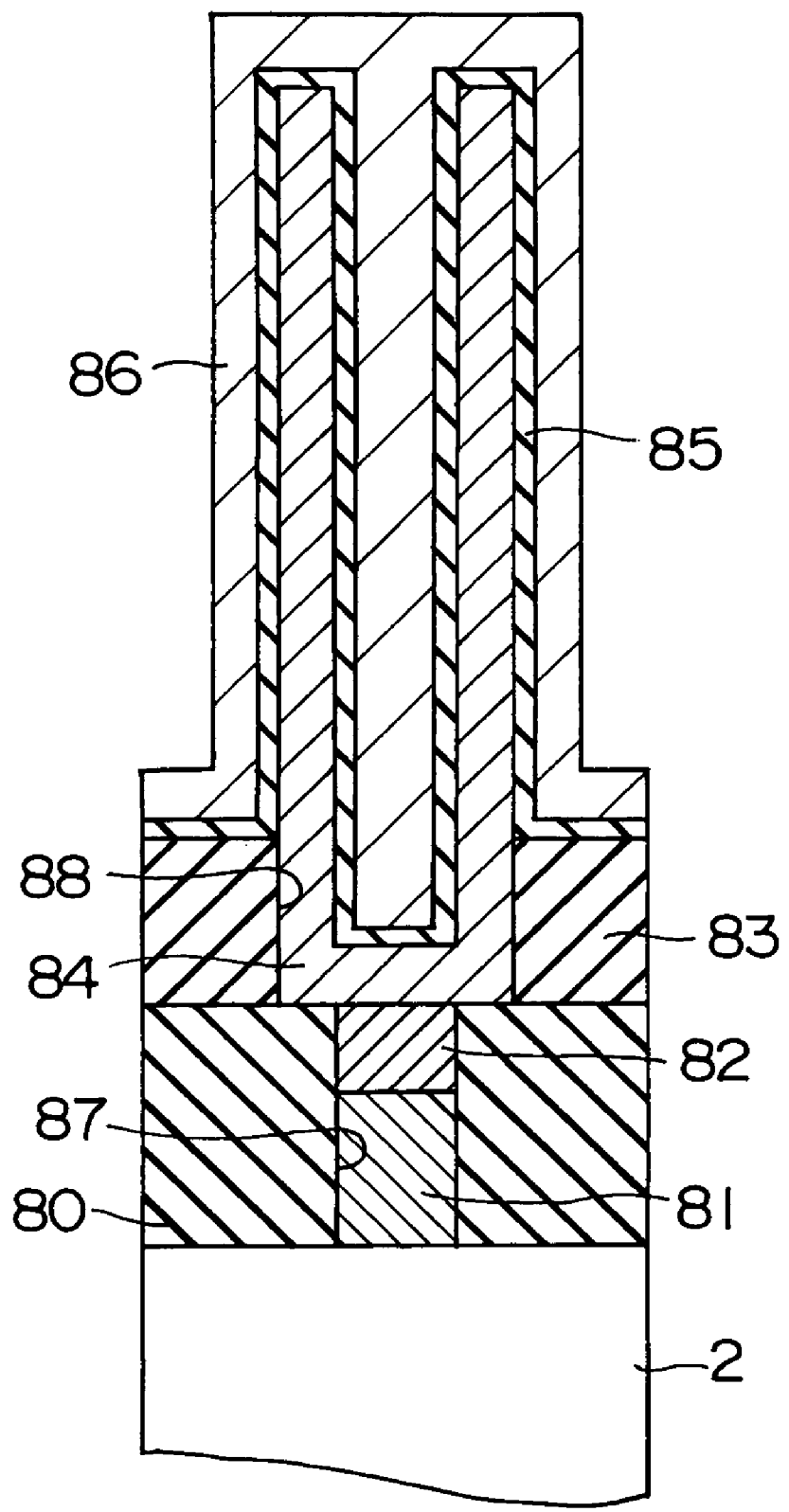
FIG. 7 is a cross sectional view showing a portion of the DRAM capacitor including the upper electrode film and the lower electrode film.

Next, an embodiment in which this invention is applied to the process for forming a capacitor in the method for manufacturing a DRAM which is a type of semiconductor device, in other words, the embodiment in which the present invention is applied to the process for forming the upper electrode film and the lower electrode film of the DRAM capacitor is described using FIG. 7.

FIG. 7 is a cross sectional view showing a portion of the DRAM capacitor including the upper electrode film and the lower electrode film.

First of all, an interlayer insulation film 80 made from a dielectric such as $SiO_2$ is formed on the silicon substrate 2.

A contact hole 87 is then formed to penetrate through the interlayer insulation film 80.

A contact plug 81 for connecting with the silicon substrate 2 is next formed internally on the opened contact hole 87. Materials for the contact plug 81 include tungsten (W), etc.

A barrier metal film 82 is next formed to be embedded into the space above the contact plug 81. Materials for the barrier metal film 82 include TiN and TaN.

This barrier metal film 82 prevents oxidizer and materials forming the electrode from diffusing into the contact plug 81.

Next, an interlayer insulation film 83 is formed across the entire surface of the barrier metal film 82 and the interlayer insulation film 80.

A contact hole 88 is then formed so as to penetrate through the interlayer insulation film 83.

Next, a lower electrode film 84 made for example from Ru film is formed across the entire surface of the interlayer insulation film 83 and the inside of the contact hole 88 by applying the film forming methods of any of the first embodiment method, second embodiment method, or third embodiment method.

The lower electrode film 84 on the interlayer insulation film 83 is then removed while allowing the lower electrode film 84 within the contact hole 88 to remain.

The interior of the lower electrode film 84 within the contact hole 88 that was allowed to remain is etched, to form the lower electrode film 84 in a cylindrical shape.

A capacitive dielectric film 85 is next formed across the entire surface of the interlayer insulation film 83 and the lower electrode film 84. Material utilized for the capacitive dielectric film 85 includes $Ta_2O_5$ or $Al_2O_3$ or $ZrO_2$, etc.

Finally, an upper electrode film 86 made for example from Ru film is formed across the entire surface of the capacitive dielectric film 85 by applying the film forming methods of any of the first embodiment method, second embodiment method, or third embodiment method to complete the manufacture of the DRAM capacitor shown in FIG. 7.

If applying the above described film forming methods of any of the first embodiment method, second embodiment method, or third embodiment method to just form the lower electrode film 84 of the DRAM capacitor, when forming the upper electrode film 86; then a film forming method of just performing the main film forming step in any of the first embodiment method, second embodiment method, or third embodiment method (film forming method without the initial film forming step), or in other words a film forming method utilizing reaction gas containing oxygen atoms may be utilized.

The upper electrode film 86 for example may be formed by utilizing the thermal CVD method which simultaneously supplies a material gas and a reaction gas containing oxygen atoms, or may utilize the ALD method which alternately supplies a material gas and a reaction gas containing oxygen atoms.

When forming the upper electrode film 86 of the DRAM capacitor, the underlayer is an insulation film so that there is no problem from using reaction gas containing oxygen atoms.

In contrast to the above, when forming the lower electrode film 84, the underlayer is the barrier metal film 82 and so utilizing a reaction gas containing oxygen atoms will cause oxidation on the barrier metal film 82 serving as the underlayer. This oxidation greatly increases the contact resistance and causes the problem that the device characteristics will deteriorate.

In view of this situation, utilizing any of the first embodiment method, second embodiment method, or third embodiment method as mentioned above will prove optimal when forming the lower electrode film 84.

Typical aspects of the invention for resolving the above mentioned problems are as follows.

(1) A semiconductor device manufacturing method comprising:

a step of loading a substrate into a processing chamber;

an initial film forming step of forming a thin film with a specified thickness on the substrate by repeating one cycle operation multiple times, wherein the one cycle operation includes a step of supplying a material gas into the processing chamber to adsorb the material gas on the substrate, and a step of supplying a first reaction gas not containing oxygen atoms into the processing chamber to cause a reaction with the material gas adsorbed on the substrate in order to form a thin film on the substrate, a main film forming step of forming a thin film with a specified thickness on the thin film formed on the substrate in the initial film forming step by repeating one cycle operation multiple times, wherein the one cycle operation includes a step of supplying the material gas into the processing chamber to adsorb the material gas on the substrate, and a step of supplying a second reaction gas containing oxygen atoms into the processing chamber to cause a reaction with the material gas adsorbed on the substrate in order to form a thin film on the substrate, and a step of unloading the substrate formed with the thin film of a specified thickness from the processing chamber.

(2) The semiconductor device manufacturing method according to the first (1) aspect, wherein the first reaction gas is a gas containing hydrogen atoms.

(3) The semiconductor device manufacturing method according to the first (1) aspect, wherein the first reaction gas is $H_2$ or $NH_3$, and the second reaction gas is $O_2$.

(4) The semiconductor device manufacturing method according to the first (1) aspect, wherein after the first reaction gas and the second reaction gas being supplied into the processing chamber, the first reaction gas and the second reaction gas are activated by plasma and then supplied to the substrate.

(5) The semiconductor device manufacturing method according to the first (1) aspect, wherein after the first reaction gas and the second reaction gas being supplied into the processing chamber, the first reaction gas and the second reaction gas are activated by plasma generated by applying RF electric power to a RF electrode installed in the processing chamber and then supplied to the substrate; and the value of the RF electric power applied to the RF electrode during supply of the first reaction gas is different from the value of the RF electric power applied to the RF electrode during supply of the second reaction gas.

(6) The semiconductor device manufacturing method according to the first (1) aspect, wherein the step of supplying the first reaction gas includes a step of supplying the first reaction gas into the processing chamber to fill the interior of the processing chamber entirely with the first reaction gas, and a step of applying RF electric power to the RF electrode installed in the processing chamber to generate plasma in a state where the processing chamber is filled entirely with the first reaction gas and supplying the first reaction gas activated by the plasma to the substrate.

(7) The semiconductor device manufacturing method according to the sixth (6) aspect, wherein the step of supplying the second reaction gas includes a step of supplying the second reaction gas into the processing chamber to fill the interior of the processing chamber entirely with the second reaction gas, and a step of applying RF electric power to the RF electrode installed in the processing chamber to generate plasma in a state where the processing chamber is filled entirely with the second reaction gas and supplying the second reaction gas activated by the plasma to the substrate.

(8) A semiconductor device manufacturing method comprising:

a step of loading a substrate into a processing chamber, an initial film forming step of forming a thin film with a specified thickness on the substrate by repeating one cycle operation multiple times, wherein the one cycle operation includes a step of supplying a material gas into the processing chamber, a step of supplying a first reaction gas not containing oxygen atoms into the processing chamber to fill the interior of the processing chamber entirely with the first reaction gas, and a step of applying RF electric power to a RF electrode installed in the processing chamber to generate plasma in a state where the processing chamber is filled entirely with the first reaction gas and supplying the first reaction gas activated by the plasma to the substrate, a main film forming step of forming a thin film with a specified thickness on the thin film formed on the substrate in the initial film forming step by repeating one cycle operation multiple times, wherein the one cycle operation includes a step of supplying the material gas into the processing chamber, a step of supplying a second reaction gas containing oxygen atoms into the processing chamber to fill the interior of the processing chamber entirely with the second reaction gas, and a step of applying RF electric power to the RF electrode installed in the processing chamber to generate plasma in a state where the processing chamber is filled entirely with the second reaction gas and supplying the second reaction gas activated by the plasma to the substrate, and a step of unloading the substrate formed with the thin film of a specified thickness from the processing chamber.

(9) A semiconductor device manufacturing method comprising:

a step of loading a substrate into a processing chamber, a step of forming a thin film with a specified thickness on the substrate by repeating one cycle operation multiple times, wherein the one cycle operation includes a step of supplying a material gas into the processing chamber, a step of supplying a reaction gas into the processing chamber to fill the interior of the processing chamber entirely with the reaction gas, and a step of applying RF electric power to a RF electrode installed in the processing chamber to generate plasma in a state where the processing chamber is filled entirely with the reaction gas and supplying the reaction gas activated by the plasma to the substrate, and a step of unloading the substrate formed with the thin film of a specified thickness from the processing chamber.

(10) A substrate processing apparatus comprising:

a processing chamber for processing a substrate, a material gas supply line for supplying material gas into the processing chamber, a first reaction gas supply line for supplying a first reaction gas not containing oxygen atoms into the processing chamber, a second reaction gas supply line for supplying a second reaction gas containing oxygen atoms into the processing chamber, an exhaust line for exhausting the interior of the processing chamber, and a controller for regulating operation to perform multiple cycles where one cycle includes supplying of the material gas into the processing chamber, and supplying of the second reaction gas into the processing chamber, after performing multiple cycles where one cycle includes supplying of the material gas into the processing chamber, and supplying of the first reaction gas into the processing chamber.

(11) A substrate processing apparatus comprising:

a processing chamber for processing a substrate, a material gas supply line for supplying material gas into the processing chamber, a first reaction gas supply line for supplying a first reaction gas not containing oxygen atoms into the processing chamber, a second reaction gas supply line for supplying a second reaction gas containing oxygen atoms into the processing chamber, a RF electrode installed in the processing chamber to generate plasma, a RF electric power supply for applying RF electric power to the RF electrode, an exhaust line for exhausting the interior of the processing chamber, and a controller for regulating operation of supplying the material gas into the processing chamber, and then supplying the first reaction gas into the processing chamber to fill the interior of the processing chamber entirely with the first reaction gas, and in that state applying RF electric power to the RF electrode to generate plasma and supplying the first reaction gas activated by the plasma to the substrate, and after repeating the above operation as one cycle for multiple cycles, supplying the material gas into the processing chamber, and then supplying the second reaction gas into the processing chamber to fill the interior of the processing chamber entirely with the second reaction gas, and in that state applying RF electric power to the RF electrode to generate plasma and supplying the second reaction gas activated by the plasma to the substrate, and repeating the above operation as one cycle for multiple cycles.

(12) A substrate processing apparatus comprising:

a processing chamber for processing a substrate, a material gas supply line for supplying material gas into the processing chamber, a reaction gas supply line for supplying a reaction gas into the processing chamber, a RF electrode installed in the processing chamber to generate plasma, a RF electric power supply for applying RF electric power to the RF electrode, an exhaust line for exhausting the interior of the processing chamber, a controller for regulating operation of supplying the material gas into the processing chamber, and then supplying the reaction gas into the processing chamber to fill the interior of the processing chamber entirely with the reaction gas, and in that state applying RF electric power to the RF electrode to generate plasma and supplying the reaction gas activated by the plasma to the substrate, and repeating the above operation as one cycle for multiple cycles.

The invention claimed is:

1. A semiconductor device manufacturing method comprising:

loading a substrate into a processing chamber;

forming an initial portion of a thin film with a specified thickness on the substrate by repeating a first one cycle operation multiple times, wherein the first one cycle operation includes supplying a material gas into the processing chamber, and supplying a first reaction gas not containing oxygen atoms into the processing chamber, forming a main portion of the thin film on the initial portion of the thin film formed on the substrate by repeating a second one cycle operation multiple times, wherein the second one cycle operation includes supplying the same material gas as the material gas used in the forming of the initial portion of the thin film into the processing chamber, and supplying a second reaction gas containing oxygen atoms into the processing chamber, and unloading the substrate formed with the thin film of the specified thickness from the processing chamber.

2. The semiconductor device manufacturing method according to claim 1, wherein the first reaction gas is a gas containing hydrogen atoms.

3. The semiconductor device manufacturing method according to claim 1, wherein the first reaction gas is $H_2$ or $NH_3$, and the second reaction gas is $O_2$.

4. The semiconductor device manufacturing method according to claim 1, comprising, after the first reaction gas and the second reaction gas are supplied into the processing chamber, respectively activating and then supplying to the substrate the first reaction gas and the second reaction gas.

5. The semiconductor device manufacturing method according to claim 4, wherein the first reaction gas and the second reaction gas are activated by plasma generated by applying RF electric power to a RF electrode installed in the processing chamber and the value of the RF electric power applied to the RF electrode during supply of the first reaction gas is different from the value of the RF electric power applied to the RF electrode during supply of the second reaction gas.

6. The semiconductor device manufacturing method according to claim 1, wherein the supplying of the first reaction gas includes supplying the first reaction gas into the processing chamber to fill the interior of the processing chamber entirely with the first reaction gas, and applying RF electric power to a RF electrode installed in the processing chamber to generate plasma in a state where the processing chamber is filled entirely with the first reaction gas and supplying the first reaction gas activated by the plasma to the substrate.

7. The semiconductor device manufacturing method according to claim 6, wherein the supplying of the second reaction gas includes a step of supplying the second reaction gas into the processing chamber to fill the interior of the processing chamber entirely with the second reaction gas, and applying RF electric power to the RF electrode installed in the processing chamber to generate plasma in a state where the processing chamber is filled entirely with the second reaction gas and supplying the second reaction gas activated by the plasma to the substrate.

8. A semiconductor device manufacturing method comprising:
loading a substrate into a processing chamber,
forming an initial portion of a thin film with a specified thickness on the substrate by repeating a first one cycle operation multiple times, wherein the first one cycle operation includes supplying a material gas into the processing chamber, supplying a first reaction gas not containing oxygen atoms into the processing chamber to fill the interior of the processing chamber entirely with the first reaction gas, and applying RF electric power to a RF electrode installed in the processing chamber to generate plasma in a state where the processing chamber is filled entirely with the first reaction gas and supplying the first reaction gas activated by the plasma to the substrate,
forming a main portion of the thin film on the initial portion of the thin film formed on the substrate by repeating a second one cycle operation multiple times, wherein the second one cycle operation includes supplying the same material gas as the material gas used in the forming of the initial portion of the thin film into the processing chamber, supplying a second reaction gas containing oxygen atoms into the processing chamber to fill the interior of the processing chamber entirely with the second reaction gas, and applying RF electric power to the RF electrode installed in the processing chamber to generate plasma in a state where the processing chamber is filled entirely with the second reaction gas and supplying the second reaction gas activated by the plasma to the substrate, and
unloading the substrate formed with the thin film of the specified thickness from the processing chamber.

9. A substrate processing apparatus comprising:
a processing chamber for processing a substrate,
a material gas supply line for supplying a material gas into the processing chamber,
a first reaction gas supply line for supplying a first reaction gas not containing oxygen atoms into the processing chamber,
a second reaction gas supply line for supplying a second reaction gas containing oxygen atoms into the processing chamber,
an exhaust line for exhausting the interior of the processing chamber, and
a controller for executing a control such that an initial portion of a thin film with a specified thickness is formed on a substrate accommodated in the processing chamber by repeating a first one cycle operation multiple times, wherein the first one cycle operation includes supplying the material gas into the processing chamber, and supplying the first reaction gas into the processing chamber, and a main portion of the thin film is formed on the initial portion of the thin film formed on the substrate by repeating a second one cycle operation multiple times, wherein the second one cycle operation includes supplying the same material gas as the material gas used in the forming of the initial portion of the thin film into the processing chamber, and supplying the second reaction gas into the processing chamber.

10. A substrate processing apparatus comprising:
a processing chamber for processing a substrate,
a material gas supply line for supplying a material gas into the processing chamber,
a first reaction gas supply line for supplying a first reaction gas not containing oxygen atoms into the processing chamber,
a second reaction gas supply line for supplying a second reaction gas containing oxygen atoms into the processing chamber,
a RF electrode installed in the processing chamber to generate plasma,
a RF electric power supply for applying RF electric power to the RF electrode,
an exhaust line for exhausting the interior of the processing chamber, and
a controller for executing a control such that an initial portion of a thin film with a specified thickness is formed on a substrate accommodated in the processing chamber by repeating a first one cycle operation multiple times, wherein the first one cycle operation includes supplying the material gas into the processing chamber, supplying the first reaction gas into the processing chamber to fill the interior of the processing chamber entirely with the first reaction gas, and applying RF electric power to the RF electrode to generate plasma in a state where the processing chamber is filled entirely with the first reaction gas and supplying the first reaction gas activated by the plasma to the substrate, and a main portion of the thin film is formed on the initial portion of the thin film formed on the substrate by repeating a second one cycle operation multiple times, wherein the second one cycle operation includes supplying the same material gas as the material gas used in the forming of the initial portion of the thin film into the processing chamber, supplying the second reaction gas into the processing chamber to fill the interior of the processing chamber entirely with the second reaction gas, and applying RF electric power to the RF electrode to generate plasma in a state where the processing chamber is filled entirely with the second reaction gas and supplying the second reaction gas activated by the plasma to the substrate.

11. The semiconductor device manufacturing method according to claim 1, wherein the material gas comprises ruthenium.

12. The semiconductor device manufacturing method according to claim 8, wherein the material gas comprises ruthenium.

13. The substrate processing apparatus according to claim 9, wherein the material gas comprises ruthenium.

14. The substrate processing apparatus according to claim 10, wherein the material gas comprises ruthenium.

15. A semiconductor device manufacturing method comprising:
   loading a substrate into a processing chamber;
   forming an initial portion of a thin film with a specified thickness on the substrate by alternately supplying a material gas and a first reaction gas not containing oxygen atoms into the processing chamber,
   forming a main portion of the thin film on the initial portion of the thin film formed on the substrate by alternately supplying the same material gas as the material gas used in the forming of the initial portion of the thin film and a second reaction gas containing oxygen atoms into the processing chamber, and
   unloading the substrate formed with the thin film of the specified thickness from the processing chamber.

16. A substrate processing method comprising:
   loading a substrate into a processing chamber;
   forming an initial portion of a thin film with a specified thickness on the substrate by alternately supplying a material gas and a first reaction gas not containing oxygen atoms into the processing chamber,
   forming a main portion of the thin film on the initial portion of the thin film formed on the substrate by alternately supplying the same material gas as the material gas used in the forming of the initial portion of the thin film and a second reaction gas containing oxygen atoms into the processing chamber, and
   unloading the substrate formed with the thin film of the specified thickness from the processing chamber.

* * * * *